United States Patent
Kim et al.

(10) Patent No.: US 9,583,541 B2
(45) Date of Patent: Feb. 28, 2017

(54) ORGANIC LIGHT-EMITTING DEVICE

(71) Applicant: LG DISPLAY CO., LTD., Seoul (KR)

(72) Inventors: Jung Bum Kim, Daejeon (KR); Minsoo Kang, Daejeon (KR); Hyeon Choi, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/611,576

(22) Filed: Feb. 2, 2015

(65) Prior Publication Data

US 2015/0155337 A1    Jun. 4, 2015

Related U.S. Application Data

(62) Division of application No. 13/817,773, filed as application No. PCT/KR2011/006035 on Aug. 17, 2011, now Pat. No. 8,994,011.

(30) Foreign Application Priority Data

Aug. 17, 2010 (KR) ........................ 10-2010-0079108

(51) Int. Cl.
*H01L 27/32* (2006.01)
*H01L 51/00* (2006.01)
(Continued)

(52) U.S. Cl.
CPC ...... *H01L 27/3209* (2013.01); *H01L 27/3202* (2013.01); *H01L 51/0096* (2013.01);
(Continued)

(58) Field of Classification Search
CPC ........... H01L 51/5278; H01L 2251/564; H01L 27/3209; H01L 51/5265; H01L 51/5056;
(Continued)

(56) References Cited

U.S. PATENT DOCUMENTS

2004/0027059 A1    2/2004  Tsutsui
2004/0032220 A1    2/2004  Cok et al.
(Continued)

FOREIGN PATENT DOCUMENTS

CN        1483960 A      3/2004
CN      101371619 A      2/2009
(Continued)

OTHER PUBLICATIONS

Hybond, "About Wire Bonding," Jul. 15, 2007, What is wire bonding.*

(Continued)

*Primary Examiner* — John P Dulka
*Assistant Examiner* — Christina Sylvia
(74) *Attorney, Agent, or Firm* — Dentons US LLP

(57) ABSTRACT

The present invention provides an organic light emitting device including: a substrate; and two or more stacked light emitting elements, which comprise a first electrode, at least one intermediate electrode, a second electrode, and an organic material layer disposed between the electrodes, the stacked organic light emitting elements including a first group of electrodes electrically connected to each other such that among the electrodes, at least two electrodes, which are not adjacent to each other, become a common electric potential, and a second group of electrodes which include one electrode among electrodes which are not electrically connected to the first group of electrodes, or at least two electrodes which are not electrically connected to the first group of electrodes and are electrically connected to each other so as to be a common electric potential without being adjacent to each other, in which the stacked organic light emitting elements are disposed at an interval apart from each other on the substrate and driven by an alternating current power source such that a form, in which a first group of
(Continued)

electrodes of one stacked organic light emitting element among the stacked organic light emitting elements are directly connected to a second group of electrodes of another stacked organic light element, is continuously repeated.

7 Claims, 4 Drawing Sheets

(51) Int. Cl.
*H01L 51/52* (2006.01)
*H01L 51/50* (2006.01)

(52) U.S. Cl.
CPC ...... *H01L 51/5056* (2013.01); *H01L 51/5072* (2013.01); *H01L 51/5215* (2013.01); *H01L 51/5218* (2013.01); *H01L 51/5221* (2013.01); *H01L 51/5234* (2013.01); *H01L 51/5265* (2013.01); *H01L 2251/306* (2013.01); *H01L 2251/308* (2013.01)

(58) Field of Classification Search
CPC ............. H01L 51/5218; H01L 51/5072; H01L 51/52343
USPC ........................................... 257/790, 40, 421
See application file for complete search history.

(56) References Cited

U.S. PATENT DOCUMENTS

| | | | | |
|---|---|---|---|---|
| 2005/0189875 A1* | 9/2005 | Nakada | ............... | H01L 27/3209 313/504 |
| 2006/0006792 A1* | 1/2006 | Strip | .................. | H01L 27/3209 313/500 |
| 2009/0009101 A1* | 1/2009 | Kang | .................. | H01L 27/3209 315/250 |
| 2011/0095702 A1* | 4/2011 | Lee | ..................... | H01L 27/3202 315/294 |

FOREIGN PATENT DOCUMENTS

| | | |
|---|---|---|
| JP | 2004-095546 A | 3/2004 |
| JP | 2004-134385 A | 4/2004 |
| JP | 2009-038640 A | 2/2005 |
| JP | 2009-164070 A | 7/2009 |
| KR | 10-2006-0042177 A | 5/2006 |
| KR | 10-2007-0063977 A | 6/2007 |
| KR | 10-2007-0076521 A | 7/2007 |

OTHER PUBLICATIONS

Written Search Report dated Feb. 28, 2012.
Korean Office Action dated Dec. 2, 2012.
Office Action of Korean Patent Office in Appl'n No. 10-2014-0016850 dated Mar. 24, 2014.

* cited by examiner

ORGANIC LIGHT-EMITTING DEVICE

This application is a Divisional of application Ser. No. 13/817,773, filed Feb. 19, 2013, which is a 35 USC §371 National Stage entry of International Application No. PCT/KR2011/006035, filed on Aug. 17, 2011, and claims priority to and the benefit of Korean Patent Application No. 10-2010-0079108, filed in the Korean Intellectual Property Office on Aug. 17, 2010, all of which are hereby incorporated by reference in their entireties as if fully set forth herein.

TECHNICAL FIELD

The present invention relates to an organic light emitting device including a stacked organic light emitting element, and more particularly, to an organic light emitting device which may be directly driven by an alternating current power source without a converter which converts alternating current into direct current.

BACKGROUND ART

An organic light emitting element using the organic light emission phenomenon is actively applied to various illumination devices due to an advantage in that high luminance may be implemented at a low voltage, and is actively applied to display devices due to advantages such as low-voltage driving, light weight and slim style, wide viewing angle, high speed response and the like.

The organic light emission phenomenon refers to a phenomenon that electric energy is converted into light energy by using an organic material. That is, when an organic material layer is disposed between an anode and a cathode, if voltage is applied between the two electrodes, holes from the anode and electrons from the cathode are injected into the organic material layer. When the injected holes and electrons meet each other, an exciton is formed, and when the exciton again falls down to a ground state, light is emitted.

DETAILED DESCRIPTION OF THE INVENTION

Technical Problem

Accordingly, an object of the present invention is to provide an organic light emitting device which may be directly driven by an alternating current power source without a converter which converts alternating current into direct current.

Technical Solution

The present invention provides an organic light emitting device including: a substrate; and two or more stacked light emitting elements, which comprise a first electrode, at least one intermediate electrode, a second electrode, and an organic material layer disposed between the electrodes, the stacked organic light emitting elements including a first group of electrodes electrically connected to each other such that among the electrodes, at least two electrodes, which are not adjacent to each other, become a common electric potential, and a second group of electrodes which includes one electrode among electrodes which are not electrically connected to the first group of electrodes, or at least two electrodes which are not electrically connected to the first group of electrodes and are electrically connected to each other so as to be a common electric potential without being adjacent to each other, in which the stacked organic light emitting elements are disposed at an interval apart from each other on the substrate and driven by an alternating current power source such that a form, in which a first group of electrodes of one stacked organic light emitting element among the stacked organic light emitting elements are directly connected to a second group of electrodes of another stacked organic light emitting element, is continuously repeated.

Advantageous Effects

According to the present invention, it is possible to provide an organic light emitting device which may be directly driven by an alternating current power source without a converter which converts alternating current into direct current. Further, it is possible to provide an organic light emitting device capable of implementing various light emission colors.

BEST MODE

An organic light emitting device according to the present invention includes a substrate; and two or more stacked organic light emitting elements, which comprise a first electrode, at least one intermediate electrode, a second electrode, and an organic material layer disposed between the electrodes, the stacked organic light emitting elements including a first group of electrodes electrically connected to each other such that among the electrodes, at least two electrodes, which are not adjacent to each other, become a common electric potential, and a second group of electrodes which includes one electrode among electrodes which are not electrically connected to the first group of electrodes, or at least two electrodes electrically connected to each other so as to be a common electric potential without being adjacent to each other.

Here, there is no upper limit on the number of stacked organic light emitting elements, but when an alternating current power source of 110 V is applied, the number may be 17 to 20, and in the case of 220 V, the number may be 35 to 38. However, the number is not limited thereto.

Here, the stacked organic light emitting elements are disposed at an interval apart from each other on the substrate and driven by an alternating current power source such that a form, in which a first group of electrodes of the one stacked organic light emitting element among the stacked organic light emitting elements are directly connected to a second group of electrodes of another stacked organic light emitting element, is continuously repeated.

Figure 1:
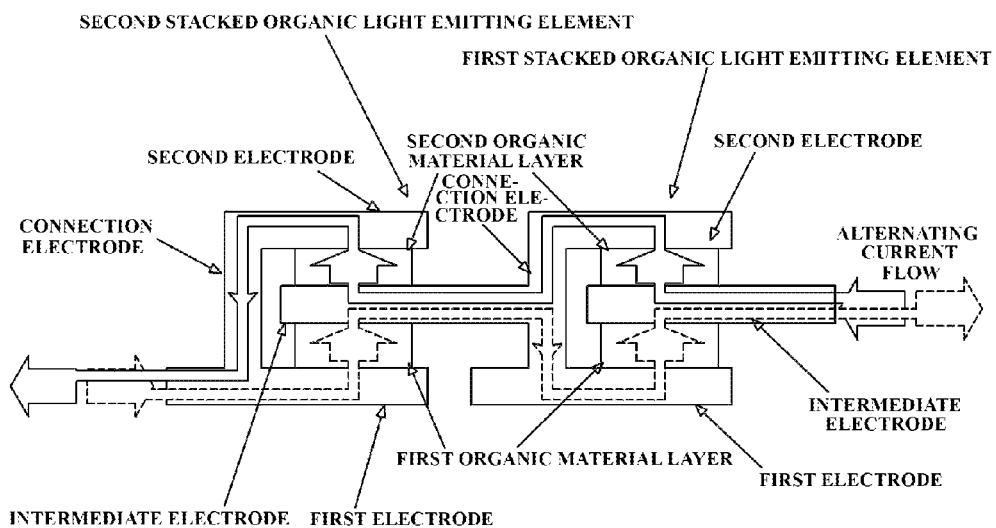
FIGS. 1 and 2 are views illustrating the driving of an organic light emitting device according to an exemplary embodiment of the present invention.

FIG. 1 is a view illustrating an organic light emitting device according to an exemplary embodiment of the present invention, and illustrates an aspect that two organic light emitting elements are stacked, in which two stacked organic light emitting elements are connected to each other.

Figure 2:
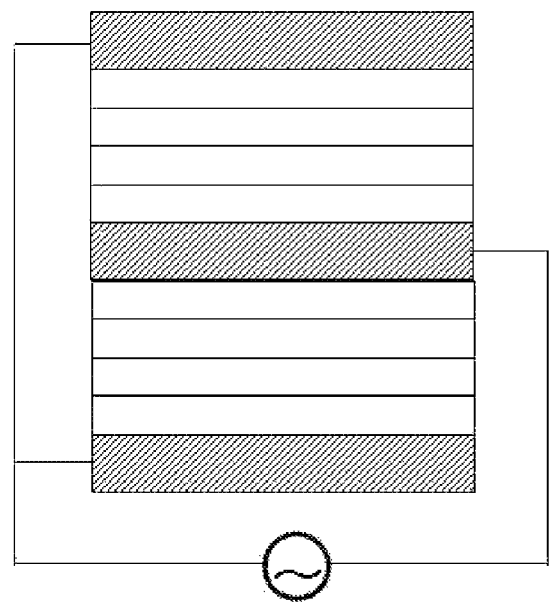

FIG. 2 is a view schematically illustrating an organic light emitting device according to an exemplary embodiment of the present invention, and illustrates an aspect that two organic light emitting elements are stacked.

According to the exemplary embodiment of the present invention, each of the stacked organic light emitting elements may include a first electrode, a first organic material layer, one intermediate electrode, a second organic material layer, a second electrode, and a connection electrode which connects the first electrode and the second electrode, a first group of electrodes of each of the stacked light emitting elements are the first electrode and the second electrode, which are connected by the connection electrode, and a second group of electrodes thereof are the one intermediate electrode, and as a form, in which the connection electrode, which forms a first group of electrodes of one stacked organic light emitting element among the stacked organic light emitting elements, is directly connected to the intermediate electrode which is a second group of electrodes of another stacked organic light emitting element, is provided, a first group of electrodes of the stacked organic light emitting elements are continuously connected in series and a second group of electrodes thereof are continuously connected in series, and thus each of the stacked organic light emitting elements may be driven by the alternating current power source.

Moreover, the connection form of the connection electrode of one stacked organic light emitting element and the intermediate electrode of another stacked organic light emitting element may include a form in which the connection is extended from a central region of the connection electrode to the intermediate electrode.

The central region in the description of the specification means a certain region of a connection electrode, which is extended and formed in a vertical direction to the plate plane of the substrate in FIG. 1, in a structure in which an intermediate electrode of the adjacent organic light emitting element is extended and formed in a horizontal direction, and is not always limited to the exact center.

In addition, the connection electrode may be extended and formed in a vertical direction to the plate plane of the substrate from the first electrode to the second electrode.

Furthermore, the first organic material layer and the second organic material layer may be disposed on an axis line which is the same as or different from an axis line which is vertical to the plate plane of the substrate.

In an organic light emitting device having such a configuration according to the present invention, when alternating current flows in one direction while the alternating current power source is supplied, each of the first organic material layers of the stacked organic light emitting elements may continuously emit light in order, and when the alternating current flows in a direction opposite to the one direction, each of the second organic material layers of the stacked organic light emitting elements may continuously emit light in order.

As an example, when the alternating current flows in the one direction, the first organic material layers emit light as one color of red and blue, and when the alternating current flows in a direction opposite to the one direction, the second organic material layers may emit color as the other color of red and blue.

Figure 4:
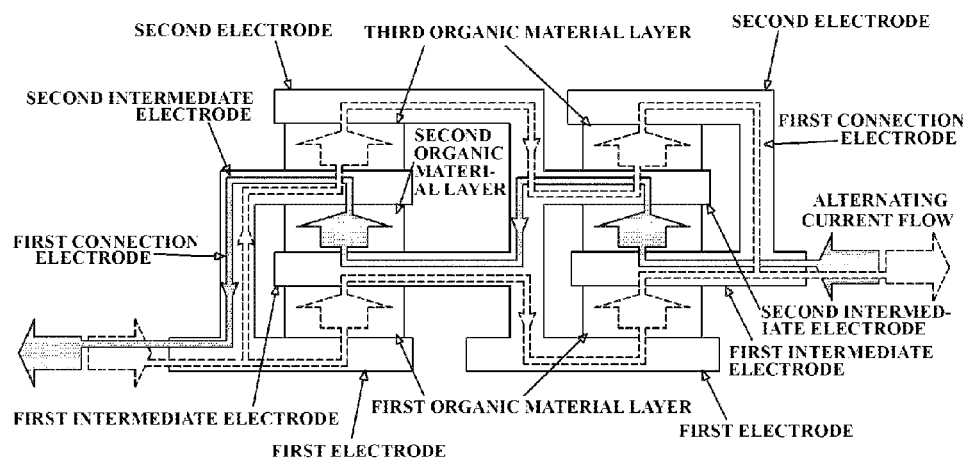
FIGS. 4 and 5 are views illustrating the driving of an organic light emitting device according to another exemplary embodiment of the present invention.

FIG. 4 is a view illustrating an organic light emitting device according to another exemplary embodiment of the present invention, and illustrates an aspect that three organic light emitting elements are stacked, in which two stacked organic light emitting elements are connected to each other.

Figure 5:
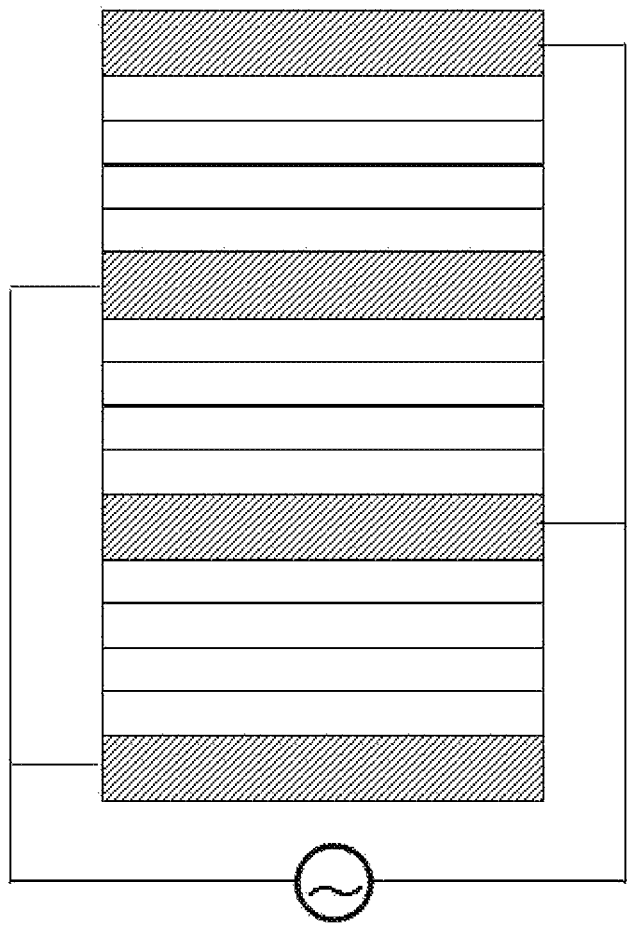
Figure 6:
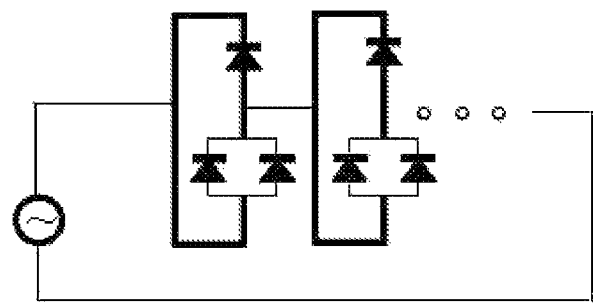
FIG. 6 is a view illustrating an equivalent circuit diagram of the organic light emitting device according to another exemplary embodiment of the present invention.

FIG. 5 is a view schematically illustrating an organic light emitting device according to another exemplary embodiment of the present invention, and illustrates an aspect that three organic light emitting elements are stacked.

According to the embodiment of the present invention, each of the stacked organic light emitting elements may include a first electrode, a first organic material layer, a first intermediate electrode, a second organic material layer, a second intermediate electrode, a third organic material layer, a second electrode, a first connection electrode which connects the first electrode and the second intermediate electrode, and a second connection electrode which connects the first intermediate electrode and the second electrode.

In this case, a first group of electrodes of each of the stacked organic light emitting elements are the first electrode and the second intermediate electrode, which are connected by the first connection electrode, and a second group of electrodes thereof are the first intermediate electrode and the second electrode, which are connected by the second connection electrode, and as a form, in which the first connection electrode, which forms a first group of electrodes of one stacked organic light emitting element among the stacked organic light emitting elements, is directly connected to the second connection electrode which forms a second group of electrodes of another stacked organic light emitting element, is provided, a first group of electrodes of one stacked organic light emitting element among the stacked organic light emitting elements and a first group of electrodes of another adjacent stacked organic light emitting element are continuously connected in series and a second group of electrodes of one stacked organic light emitting element among the stacked organic light emitting elements and a second group of electrodes of another adjacent stacked organic light emitting element are continuously connected in series, and thus each of the stacked organic light emitting elements may be driven by the alternating current power source.

Further, in this case, the connection form of the first connection electrode and the second connection electrode may be a form in which the first and second connection electrodes are overlapped with each other, in which a second intermediate electrode of one stacked organic light emitting element among the stacked organic light emitting elements and a first intermediate electrode of another adjacent stacked organic light emitting element are diverged in a direction opposite to each other by a connection section at which a first electrode of the one stacked organic light emitting element among the stacked organic light emitting elements is connected to a second electrode of the another adjacent stacked organic light emitting element in a vertical direction to the plate plane of the substrate.

In addition, in this case, when alternating current flows in one direction while the alternating current power source is supplied, the second organic material layers of the stacked organic light emitting elements may continuously emit light in order, and when alternating current flows in a direction opposite to the one direction, the first and third organic material layers of the stacked organic light emitting elements may continuously emit light in order.

Figure 7:
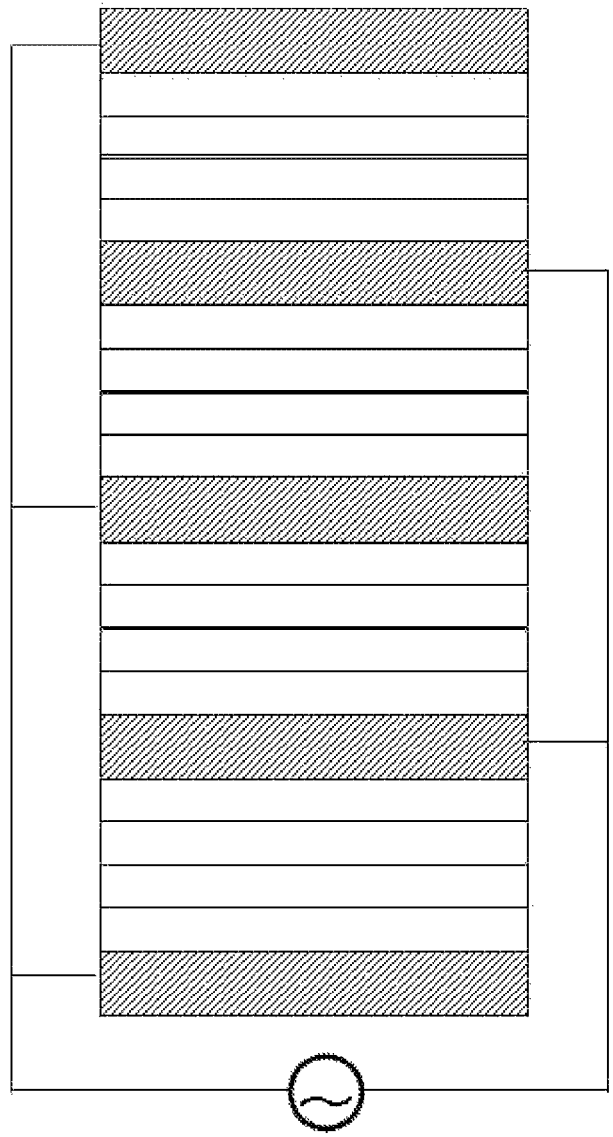
FIG. 7 is a view illustrating the driving of an organic light emitting device according to yet another exemplary embodiment of the present invention.
Figure 8:
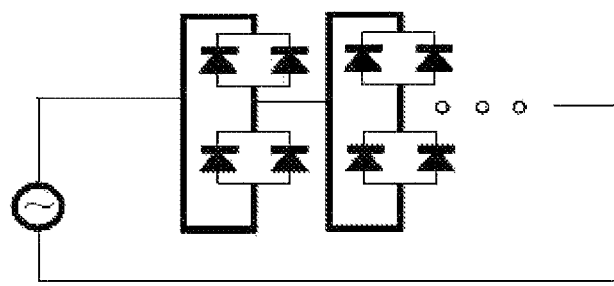
FIG. 8 is a view illustrating an equivalent circuit diagram of the organic light emitting device according to yet another exemplary embodiment of the present invention.

FIG. 7 is a view schematically illustrating an organic light emitting device according to yet another exemplary embodiment of the present invention, and illustrates an aspect that four organic light emitting elements are stacked.

According to the exemplary embodiment of the present invention, each of the stacked organic light emitting elements may include a first electrode; a first organic material layer; a first intermediate electrode; a second organic material layer; a second intermediate electrode; a third organic material layer; a third intermediate electrode; a fourth organic material layer; a second electrode; a first connection electrode which connects the first electrode, the second intermediate electrode and the second electrode; and a second connection electrode which connects the first intermediate electrode and the third intermediate electrode.

In this case, a first group of electrodes of each of the stacked organic light emitting elements are the first electrode, the second intermediate electrode, and the second electrode, which are connected by the first connection electrode, and a second group of electrodes thereof are the first intermediate electrode and the third intermediate electrode, which are connected by the second connection electrode, and as a form, in which the first connection electrode, which forms a first group of electrodes of one stacked organic light emitting element among the stacked organic light emitting elements, is directly connected to the second connection electrode which forms a second group of electrodes of another stacked organic light emitting element, is provided, a first group of electrodes of one stacked organic light emitting element among the stacked organic light emitting elements and a first group of electrodes of another adjacent stacked organic light emitting element are continuously connected in series and a second group of electrodes of one stacked organic light emitting element among the stacked organic light emitting elements and a second group of electrodes of another adjacent stacked organic light emitting element are continuously connected in series, and thus each of the stacked organic light emitting elements may be driven by the alternating current power source.

Furthermore, in this case, the connection form of the first connection electrode and the second connection electrode may be a form in which the first and second connection electrodes are overlapped with each other, in which a second intermediate electrode of one stacked organic light emitting element among the stacked organic light emitting elements and first and third intermediate electrodes of another adjacent stacked organic light emitting element are diverged in a direction opposite to each other by a connection section at which a first electrode of the one stacked organic light emitting element among the stacked organic light emitting elements is connected to a second electrode of the another adjacent stacked organic light emitting element in a vertical direction to the plate plane of the substrate.

Further, in this case, when alternating current flows in one direction while the alternating current power source is supplied, the second and fourth organic material layers of the stacked organic light emitting elements may continuously emit light in order, and when alternating current flows in a direction opposite to the one direction, the first and third organic material layers of the stacked organic light emitting elements may continuously emit light in order.

Meanwhile, the substrate may be a glass substrate or a plastic substrate. Here, when the substrate is a plastic substrate, the substrate may also be a plastic substrate of a hard material or a flexible material.

One of the first electrode and the second electrode may be formed of one or more selected from indium tin oxide (ITO), indium zinc oxide (IZO), and zinc oxide (ZnO).

The other one of the first electrode and the second electrode may be formed of a metal such as magnesium, calcium, sodium, potassium, titanium, indium, yttrium, lithium, gadolinium, aluminum, silver, tin, and lead, or an alloy thereof. In addition, the other one electrode may be formed of a multilayer structured material such as LiF/Al or $LiO_2$/Al and the like.

Here, the first electrode may be a cathode formed of LiF/Al, and the second electrode may be an anode formed of transparent indium tin oxide (ITO).

Each of the first organic material layer and the second organic material layer may include a hole injection layer, a hole transporting layer, a light emitting layer, and an electron transporting layer.

The intermediate electrode may be composed of a form in which conductive layers are stacked, and may also be a single conductive layer form. When the intermediate electrode is a single conductive layer form, it is preferred that the electrode is formed of a transparent material having a visible light transmittance of 50% or more while the work function thereof has a value similar to that of a cathode material which is usually used.

When an opaque metal is used as an intermediate electrode, it is preferred that the thickness of the intermediate electrode is formed to be thin enough to make the intermediate electrode transparent.

A material for the connection electrode may be the same as or different from the material for the electrode to be connected.

The intermediate electrode and the connection electrode may be each independently formed of one or more selected from calcium, magnesium, sodium, potassium, titanium, indium, yttrium, lithium, gadolinium, aluminum, silver, tin, lead, or an alloy thereof, LiF/Al, $LiO_2$/Al, Ca—Ag, ITO, IZO, Ca-ITO, Ca-IZO, Ag-ITO, Ag-IZO, ZnO, and Ma—Ag.

In particular, the intermediate electrode may be formed by using calcium or magnesium having a low work function, and it is preferred that the intermediate electrode is formed of one or more selected from calcium, magnesium, Ca—Ag, Ca-ITO, Ca-IZO, Ag-IZO, Ag-ITO, or Ma—Ag.

In particular, when Ca-IZO is used, the visible light transmittance thereof may be improved, and accordingly, in the case of a stacked organic light emitting element, the luminance thereof increases with the same driving voltage proportionally to the number of stacked organic light emitting element units, and thus Ca-IZO is preferably used as the intermediate electrode of the organic light emitting element according to the present invention.

As described above, according to the present invention, an organic light emitting device may be directly driven by an alternating current power source without a converter which converts alternating current into direct current, and an organic light emitting device capable of implementing various light emitting colors may be provided.

Meanwhile, an electronic device including the organic light emitting device according to the present invention is provided. Examples of the electronic device include an organic EL panel, an illumination device and the like, including the organic light emitting element according to the present invention, but are not limited thereto.

MODE FOR INVENTION

Hereinafter, the present invention will be described in detail with reference to FIGS. 1 to 3. For convenience, only an organic light emitting device having a form in which two organic light emitting elements are stacked will be described, and an explanation on the configuration in which organic light emitting elements are stacked with more than the number will be omitted.

The organic light emitting device according to the present invention includes a substrate; and stacked organic light emitting elements provided on the substrate, as illustrated in FIG. 1.

Figure 3:
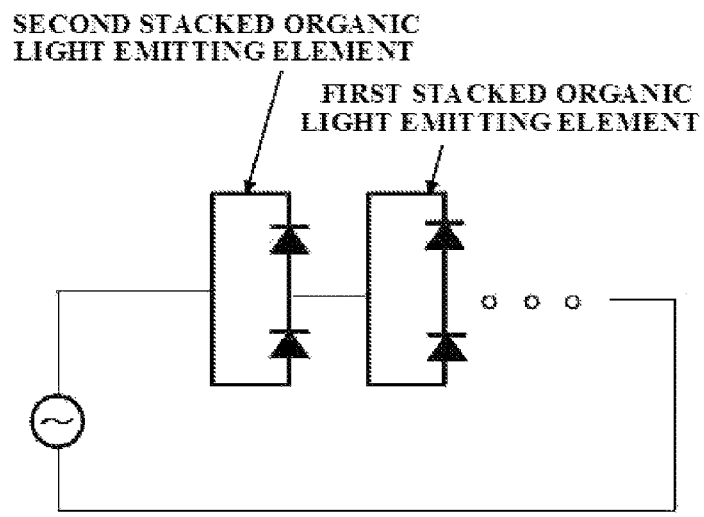
FIG. 3 is a view illustrating an equivalent circuit diagram of the organic light emitting device according to an exemplary embodiment of the present invention.

Each of the stacked organic light emitting elements may have a two layer-structure as illustrated in FIGS. 1 to 3, and stacked organic light emitting elements adjacent to each other are electrically connected to each other in series.

Hereinafter, for convenience of explanation, the stacked organic light emitting element positioned on the right will be a first stacked organic light emitting element, and the stacked organic light emitting element positioned on the left will be a second organic light emitting element.

Each of the stacked organic light emitting elements includes a first electrode, a first organic material layer, an intermediate electrode, a second organic material layer, a second electrode, and a connection electrode which connects the first electrode and the second electrode in a vertical direction, which are sequentially stacked on a substrate.

Here, the first electrode of the first stacked organic light emitting element and the first electrode of the second stacked organic light emitting element are disposed apart from each other, and the second electrode of the first stacked organic light emitting element and the second electrode of the second stacked organic light emitting element are disposed apart from each other.

Moreover, the intermediate electrode of the second stacked organic light emitting element is connected with the connection electrode of the first stacked organic light emitting element.

The first organic material layer of each stacked organic light emitting element may have a light emission color of red and the second organic material layer of each stacked organic light emitting element may have a light emission color of blue, but the emission color thereof is not limited thereto.

Hereinafter, the driving of an organic light emitting device having such a configuration according to the present invention will be described.

When an alternating current power source is applied to the organic light emitting device according to the present invention, the first and second stacked organic light emitting elements are driven while alternating current flows in both directions. This will be specifically described in parts, but the driving sequence is not limited to the following explanation.

First, when alternating current flows from the right side to the left side in FIG. 1, the alternating current flows in a sequence of the intermediate electrode of the first stacked organic light emitting element→the second organic material layer of the first stacked organic light emitting element→the second electrode of the first stacked organic light emitting element→the upper side section of the connection electrode of the first stacked organic light emitting element→the intermediate electrode of the second stacked organic light emitting element→the second organic material layer of the second stacked organic light emitting element→the second electrode of the second stacked organic light emitting element→the connection electrode of the second stacked organic light emitting element→the first electrode.

Whereby, light of the blue color may be emitted in a sequence from the second organic material layer of the first stacked organic light emitting element to the second organic material layer of the second stacked organic light emitting element.

As described above, when alternating current flows from the right side to the left side based on the state illustrated in FIG. 1, light of the blue color may be emitted in the second organic material layer of the organic light emitting device according to the present invention.

Next, when alternating current flows from the left side to the right side in FIG. 1, the alternating current flows in a sequence of the first electrode of the second stacked organic light emitting element→the first organic material layer of the second stacked organic light emitting element→the intermediate electrode of the second stacked organic light emitting element→the lower side section of the connection electrode of the first stacked organic light emitting element→the first electrode of the first stacked organic light emitting element→the first organic material layer of the first stacked organic light emitting element→the intermediate electrode of the first stacked organic light emitting element.

Whereby, light of the red color may be emitted in a sequence from the first organic material layer of the second stacked organic light emitting element to the first organic material layer of the first stacked organic light emitting element.

As described above, when alternating current flows from the left side to the right side based on the state illustrated in FIG. 1, light of the red color may be emitted in the first organic material layer of the organic light emitting device according to the present invention.

The invention claimed is:

1. An organic light emitting device, comprising:
   a substrate; and
   two or more stacked organic light emitting elements on a surface of the substrate, wherein the stacked organic light emitting elements are disposed at an interval apart from each other in a lateral direction parallel to the surface of the substrate,
   wherein each of the stacked organic light emitting elements includes a first electrode, a first organic material layer, a first intermediate electrode, wherein the first organic material layer is between the first electrode and the first intermediate electrode, a second organic material layer, a second intermediate electrode, wherein the second organic material layer is between the first intermediate electrode and the second intermediate electrode, a third organic material layer, and a second electrode, wherein the third organic material layer is between the second intermediate electrode and the second electrode,
   a first connection electrode which electrically connects the first electrode and the second intermediate electrode, and a second connection electrode which electrically connects the first intermediate electrode and the second electrode,
   a first group of electrodes which include the first electrode and the second intermediate electrode, which are electrically connected by the first connection electrode to provide a common electric potential, and a second group of electrodes which include the first intermediate electrode and the second electrode, which are electrically connected by the second connection electrode to provide a common electric potential, and as a form, in which the first connection electrode, which forms a first group of electrodes of one stacked organic light emitting element among the stacked organic light emitting elements, is directly connected to the second connection electrode which forms a second group of electrodes of another stacked organic light emitting element, is provided, a first group of electrodes of one stacked organic light emitting element of the stacked organic light emitting elements and a first group of electrodes of another adjacent stacked organic light emitting element are continuously connected in series and a second group of electrodes of one stacked organic light emitting element among the stacked organic light emitting elements and a second group of electrodes of another adjacent stacked organic light emitting element are continuously connected in series, and each of the stacked organic light emitting elements is driven by the alternating current power source, a connection form of the first connection electrode and the second connection electrode is a form in which the first and second connection electrodes are overlapped with each other, in which a second intermediate electrode of one stacked organic light emitting element among the stacked organic light emitting elements and a first intermediate electrode of another adjacent stacked organic light emitting element diverge in a direction opposite to each other by a connection section at which a first electrode of the one stacked organic light emitting element among the stacked organic light emitting elements is connected to a second electrode of the another adjacent stacked organic light emitting element in a vertical direction to the horizontal direction of the substrate, and when alternating current flows in one direction while the alternating current power source is supplied, the second organic material layers of the stacked organic light emitting elements continuously emit light in order, and when alternating current flows in a direction opposite to the one direction, the first and third organic material layers of the stacked organic light emitting elements continuously emit light in order.

2. The organic light emitting device of claim 1, wherein one of the first electrode and the second electrode is formed of one or more selected from indium tin oxide (ITO), indium zinc oxide (IZO) and zinc oxide (ZnO), and the other one thereof is formed of a metal such as magnesium, calcium, sodium, potassium, titanium, indium, yttrium, lithium, gadolinium, aluminum, silver, tin, and lead, or an alloy thereof.

3. The organic light emitting device claim 1, wherein one of the first electrode and the second electrode is formed of one or more selected from indium tin oxide (ITO), indium zinc oxide (IZO), and zinc oxide (ZnO), and the other one thereof is formed of LiF/Al or $LiO_2$/Al.

4. The organic light emitting device of claim 1, wherein the first organic material layer, the second organic material layer, and the third organic material layer are each independently an electron transporting layer, a light emitting layer, a hole transporting layer, or a hole injection layer.

5. The organic light emitting device claim 1, wherein the substrate is a glass substrate or a plastic substrate.

6. The organic light emitting device of claim 1, wherein the first intermediate electrode, the second intermediate electrode, the first connection electrode, and the second connection electrode are each independently formed of one or more selected from calcium, magnesium, sodium, potassium, titanium, indium, yttrium, lithium, gadolinium, aluminum, silver, tin, lead, or an alloy thereof, LiF/Al, $LiO_2$/Al, Ca—Ag, ITO, IZO, Ca-ITO, Ca-IZO, Ag-ITO, Ag-IZO, ZnO, and Ma-Ag.

7. The organic light emitting device of claim 1, wherein the first intermediate electrode, the second intermediate electrode, the first connection electrode, and the second connection electrode are each independently formed of one or more selected from calcium, magnesium, Ca-Ag, Ca-ITO, Ca-IZO, Ag-IZO, Ag-ITO, and Ma-Ag.

* * * * *